(12) United States Patent
Jang

(10) Patent No.: US 9,023,703 B2
(45) Date of Patent: May 5, 2015

(54) METHOD OF MANUFACTURING SEMICONDUCTOR DEVICE USING AN OXIDATION PROCESS TO INCREASE THICKNESS OF A GATE INSULATION LAYER

(71) Applicant: SK Hynix Inc., Icheon (KR)

(72) Inventor: Tae Su Jang, Gwacheon (KR)

(73) Assignee: SK Hynix Inc., Icheon (KR)

( * ) Notice: Subject to any disclaimer, the term of this patent is extended or adjusted under 35 U.S.C. 154(b) by 262 days.

(21) Appl. No.: 13/649,932

(22) Filed: Oct. 11, 2012

(65) Prior Publication Data

US 2013/0130455 A1 May 23, 2013

(30) Foreign Application Priority Data

Nov. 21, 2011 (KR) .................. 10-2011-0121692

(51) Int. Cl.
*H01L 21/336* (2006.01)
*H01L 21/8242* (2006.01)
*H01L 21/3205* (2006.01)
*H01L 29/66* (2006.01)
*H01L 29/423* (2006.01)
*H01L 27/108* (2006.01)

(52) U.S. Cl.
CPC .... *H01L 29/42356* (2013.01); *H01L 27/10823* (2013.01); *H01L 27/10876* (2013.01)

(58) Field of Classification Search
CPC ................ H01L 27/10823; H01L 29/42356; H01L 27/10876; H01L 21/28114; H01L 21/28211; H01L 29/78; H01L 29/66537; H01L 29/66621; H01L 29/42368

USPC .......... 438/212, 270, 585, 592, 239; 257/330, 257/40, 192, 336
See application file for complete search history.

(56) References Cited

U.S. PATENT DOCUMENTS

| | | |
|---|---|---|
| 2004/0222457 A1* | 11/2004 | Kim et al. ............. 257/328 |
| 2006/0234451 A1* | 10/2006 | Slesazeck et al. ........ 438/259 |
| 2007/0207582 A1* | 9/2007 | Grivna et al. .......... 438/270 |
| 2008/0283845 A1* | 11/2008 | Endo et al. ............ 257/77 |
| 2009/0101971 A1* | 4/2009 | Kujirai .............. 257/330 |
| 2009/0261420 A1* | 10/2009 | Ryu et al. ............ 257/368 |
| 2010/0044787 A1* | 2/2010 | Sugioka ............. 257/331 |
| 2010/0258861 A1* | 10/2010 | Lee et al. ............ 257/330 |
| 2010/0258862 A1* | 10/2010 | Yilmaz et al. ......... 257/330 |
| 2011/0241106 A1* | 10/2011 | Lee et al. ............ 257/330 |
| 2012/0025299 A1* | 2/2012 | Ko .................. 257/330 |

FOREIGN PATENT DOCUMENTS

| | | |
|---|---|---|
| KR | 10-2008-0062557 A | 7/2008 |
| KR | 10-2009-0002549 A | 1/2009 |
| KR | 10-2010-0092639 A | 8/2010 |

OTHER PUBLICATIONS

Machine translation Korean Patent Publication No. 10-2008-0062557.*

* cited by examiner

*Primary Examiner* — Long K Tran
*Assistant Examiner* — Dzung Tran

(57) ABSTRACT

According to a method of manufacturing a semiconductor device including a buried gate, after a recess is formed by etching a semiconductor substrate, since an etching back process is not performed on a gate electrode material buried within the recess, variability in the depth of the gate electrode material can be reduced. In addition, GIDL can be improved by a selective oxidation process and control of a thickness of a spacer and data retention time can be increased.

20 Claims, 9 Drawing Sheets

CELL ARRAY

METHOD OF MANUFACTURING SEMICONDUCTOR DEVICE USING AN OXIDATION PROCESS TO INCREASE THICKNESS OF A GATE INSULATION LAYER

CROSS-REFERENCES TO RELATED APPLICATION

The present application claims priority to Korean patent application number 10-2011-0121692 filed on Nov 21, 2011, which is incorporated by reference in its entirety.

BACKGROUND OF THE INVENTION

Embodiments of the present invention relate to a method of manufacturing a semiconductor device.

Semiconductor memory devices include a plurality of unit cells that include a capacitor and a transistor. The capacitor is used to store data temporarily, and the transistor is used to transfer data between the capacitor and a bit line in response to a control signal (a word line). The transistor has three parts; a gate, a source, and a drain. Charges move between the source and drain according to a control signal input to the gate. The charges move between the source and drain through a channel region.

When a conventional transistor is fabricated on a semiconductor substrate, the gate is formed on the semiconductor substrate and then the source and drain are formed at both sides of the gate by implanting impurities into the semiconductor substrate. Smaller unit cells are being developed to facilitate the increasing storage capacity and degree of integration of semiconductor memory devices. As a result, the design rule of a capacitor and transistor included in the unit cell is reduced, and thus a channel length of a cell transistor decreases accordingly. When applied to conventional transistors, the reduced channel length may lead to problems such as a short channel effect and drain induced barrier lowering (DIBL) Such phenomena caused due to reduction of the channel length can be overcome when a threshold voltage is maintained. Conventionally, as the channel length is shortened, a doping concentration of an impurity in a region in which the channel region is to be formed is increased.

However, as the design rule is reduced below 100 nm, the increased concentration of doping ions in an active region causes an increase to an electric field in a storage node junction, leading to degradation of a refresh characteristic. A cell transistor having a three dimensional channel structure, in which a channel having a long channel length is established in a vertical direction to maintain a channel length of a cell transistor even when the design rule is reduced, has been developed to help overcome such issues. That is, even when there is limited space for a channel in a horizontal direction, the channel length is established in the vertical direction to reduce a doping concentration, thereby preventing refresh characteristics from being degraded.

In addition, with the increasing degree of integration of semiconductor devices, a distance between a word line and a bit line connected to the cell transistor is reduced. Thus, parasitic capacitance is increased, and a sensing margin of a sense amplifier configured to amplify data transferred through the bit line is deteriorated, which has a negative effect on the operational reliability of the semiconductor device. To reduce the parasitic capacitance between the bit line and the word line, a buried word line structure, in which a word line is formed only in a recess and not on a semiconductor substrate, has been suggested. The buried word line structure, in which a word line including a conductive material formed within the recess and an insulating layer covering the conductive material is formed within a semiconductor substrate, allows the word line to make an accurate electrical separation from a bit line formed on the semiconductor substrate in which a source and drain are formed.

As described above, the buried word line structure has an overlapping region between the source and drain junctions and the word line, so gate induced drain leakage (GIDL) occurs in the is overlapping region. When GIDL is increased, accumulated charges are discharged and a memory retention characteristic is degraded.

BRIEF SUMMARY OF INVENTION

According to one aspect of an exemplary embodiment, a method of manufacturing a semiconductor device includes forming a first hard mask pattern on a semiconductor substrate, etching the semiconductor substrate to form a recess, forming a gate insulating layer and a gate electrode pattern within the recess, planarizing the gate electrode pattern until the first hard mask pattern is exposed, forming a second hard mask pattern on the gate electrode pattern, removing the first hard mask pattern, performing a selective oxidation process on an exposed gate insulating layer, forming a spacer on the second hard mask pattern and the gate electrode pattern, forming source drain regions on the semiconductor substrate, and forming a plug on each of the source/drain region.

The recess may be formed to a depth of 50 nm to 300 nm.

The method may further include performing a thermal treatment process at a gas ambient including a hydrogen gas (H2) after the forming the recess.

The forming the gate insulating layer may include forming the gate insulating layer using an oxidation process such as a thermal treatment method, a radical method, or a plasma method.

The gate electrode pattern may include any one selected from the group consisting of titanium nitride (TiN) layer, a tungsten (W) layer, a tungsten nitride (WN) layer, a stacking structure of WN and W, and a stacking structure of TiN and W.

The spacer may be formed to a thickness of 1 nm to 20 nm.

The forming the recess may include anisotropically etching the semiconductor substrate.

The forming the source and drain regions may include implanting ions having an opposite type to the semiconductor substrate at a dose of $1\times10^{10}$ ions/cm$^2$ to $1\times10^{15}$ ions/cm$^2$ with an energy of 5 keV to 100 keV.

The forming the plug may include forming the plug by combining an undoped polysilicon layer and ions. Alternatively, the forming the plug may include forming a polysilicon layer doped with ions at a dose of $5\times10^{19}$ ions/cm$^2$ to $1\times10^{21}$ ions/cm$^2$.

The forming the plug may include growing a silicon layer through a selective epitaxial growth (SEG) process and forming a doped polysilicon layer having a dose of $5\times10^{19}$ ions/cm$^2$ to $1\times10^{21}$ ions/cm$^2$.

These and other features, aspects, and embodiments are described below in the section entitled "DESCRIPTION OF EMBODIMENTS"

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1A:
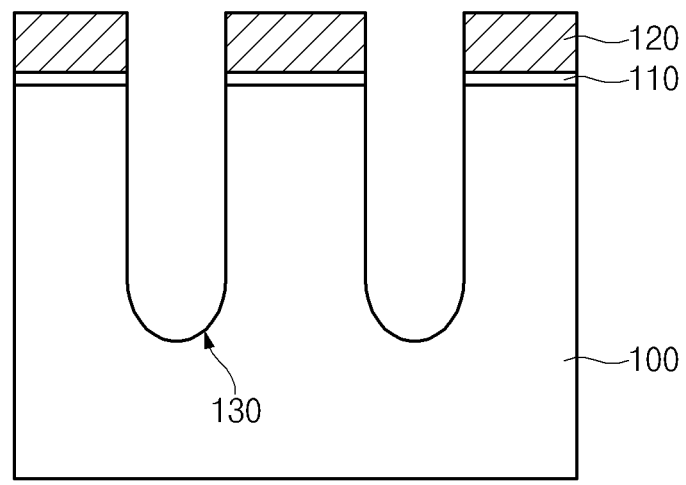
FIGS. 1A to 1H are cross-sections illustrating a method of manufacturing a semiconductor device according to an exemplary embodiment of the present invention.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing.

In the drawings, lengths and sizes of layers and regions may be exaggerated for clarity. Like reference numerals in the drawings denote like elements. It is also understood that when a layer is referred to as being "on" another layer or substrate, it can be directly on the layer or substrate, or intervening layers may also be present.

Hereinafter, exemplary embodiments of the present invention will be described in detail with reference to accompanying drawings.

FIGS. 1A to 1H are cross-sectional views illustrating a method of manufacturing a semiconductor device according to an exemplary embodiment.

Referring to FIG. 1A, an isolation region (not shown) defining an active region (not shown) is formed on a semiconductor substrate 100.

Hereinafter, a process of forming the isolation region defining the active region will be described in more detail. Pad insulating layers 110 and 120 are formed on the semiconductor substrate 100. The pad insulating layers 110 and 120 may include a pad oxide layer 110 and a pad nitride layer 120. The pad insulating layers 110 and 120 comprise a first hard mask layer. Subsequently, a photoresist layer is coated on the pad insulating layers 110 and 120 and patterned through an exposure and development process using a mask for defining an isolation region to form a photoresist pattern (not shown). The pad insulating layers 110 and 120 and the semiconductor substrate 100 are etched using the photoresist pattern as an etch mask to form a trench (not shown). Subsequently, a wall oxidation process is performed to form an oxide (not shown) on a bottom and a sidewall of the trench.

Subsequently, a liner nitride layer and a liner oxide layer are sequentially formed on the semiconductor substrate 100 including the trench in which the sidewall oxide layer is formed. In an embodiment, the liner nitride layer relieves stress applied to the semiconductor substrate 100 to improve a refresh characteristic. The liner oxide layer prevents the liner nitride layer from being oxidized in a subsequent process of depositing an insulating layer, which may be a high density plasma (HDP) layer or a silicon on dielectric (SOD) layer. Next, an SOD material is buried within the trench and planarization-etching the SOD material is performed until the pad nitride layer 120 is exposed, thereby forming the active region and the isolation region. The planarization-etching may be a chemical mechanical polishing (CMP) process.

Next, a photoresist layer (not shown) is formed on the pad nitride layer 120 and patterned through an exposure and development process using a mask for recess formation to form a photoresist pattern (not shown). The pad nitride layer 120 and the pad oxide layer 110 are etched using the photoresist pattern as an etch mask to form a pad nitride layer pattern and a pad oxide layer pattern. Subsequently, the semiconductor substrate 100 is etched using the pad nitride layer pattern and the pad oxide layer pattern as an etch mask to form recess 130. The recess 130 may be formed to a depth of 50 nm to 300 nm. Next, a thermal treatment process may be performed using hydrogen gas ($H_2$) as a reducing species to repair damage caused by etching.

Figure 1B:
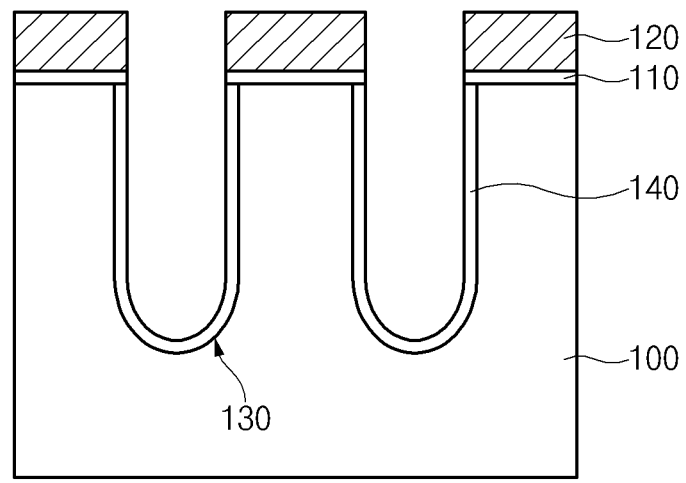
Figure 1C:
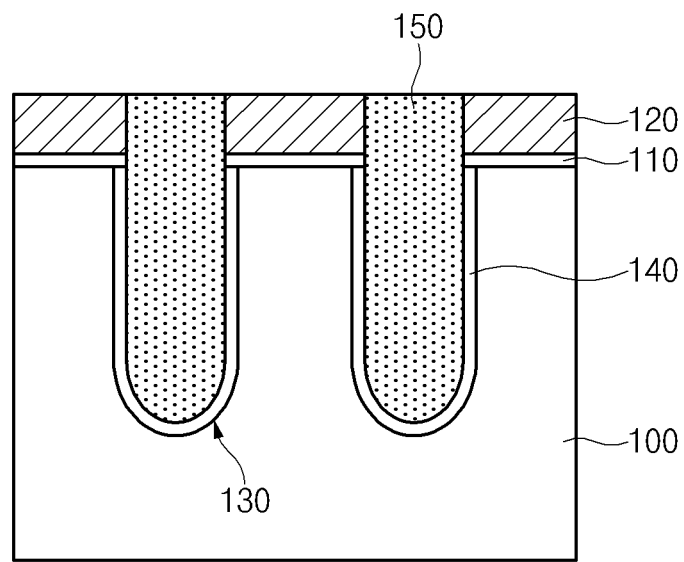

Referring to FIGS. 1B and 1C, a gate insulating layer 140 is formed on an inner surface of the recess 130 and a gate electrode material 150 is formed on the gate insulating layer 140 within the recess 130. In an embodiment, the gate electrode material may include any one selected from the group consisting of titanium nitride (TiN) layer, a tungsten (W) layer, a tungsten nitride (WN) layer, a stacking structure of WN and W, and a stacking structure of TiN and W. In another embodiment, the gate insulating layer 140 may be formed on the inner surface of the trench by performing an oxidation process. The gate insulating layer 140 may be formed to a thickness of 20 Å to 200 Å using an oxidation process such as a thermal processing method, a radical method, or a plasma process.

The gate electrode material 150 is planarization-etched using a CMP process until the pad nitride layer 120 is exposed. The CMP process can be controlled to a tolerance such that the depth of the gate electrode material may have less variation than a process that forms a gate electrode material in a recess, and etches back the gate electrode material to achieve a final depth.

Figure 1D:
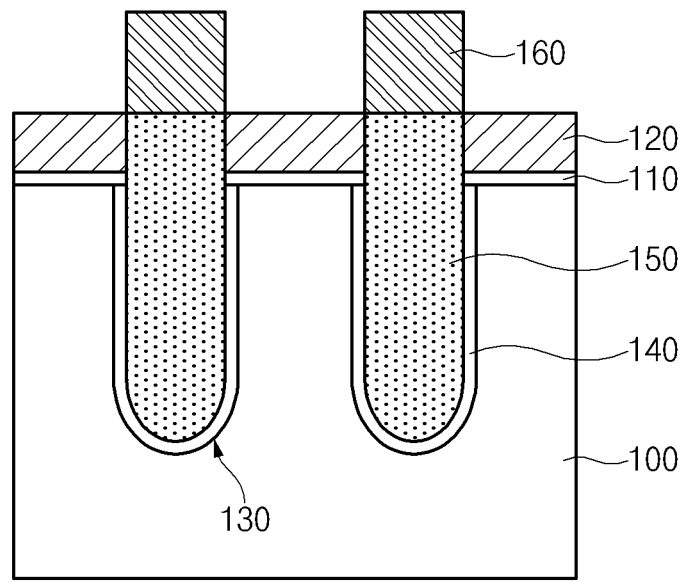

Referring to FIG. 1D, a second hard mask layer (not shown) is formed on the pad nitride layer 120 and the gate electrode material 150. In an embodiment, the second hard mask layer may include a nitride layer. The second hard mask layer is patterned using an exposure and development process to form a second hard mask pattern 160 only on the gate electrode material 150, but not on surrounding portions of pad nitride layer 120.

Figure 1E:
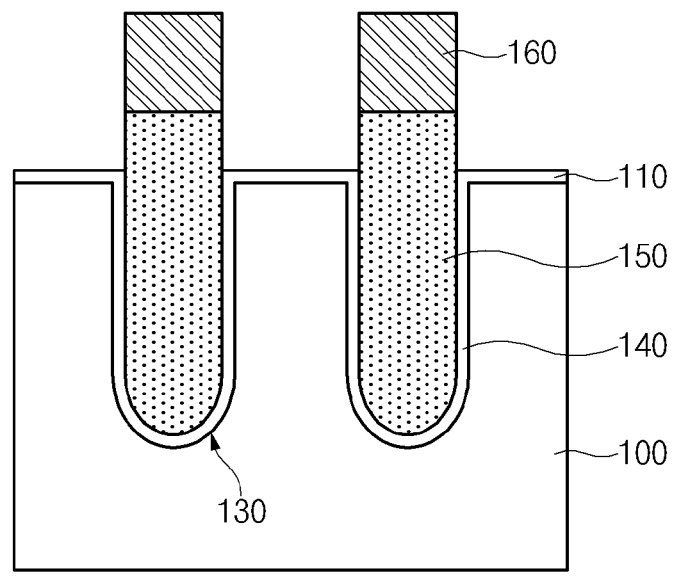

Referring to FIG. 1E, the pad nitride layer is removed using the second hard mask pattern 160 as an etch mask.

Figure 1F:
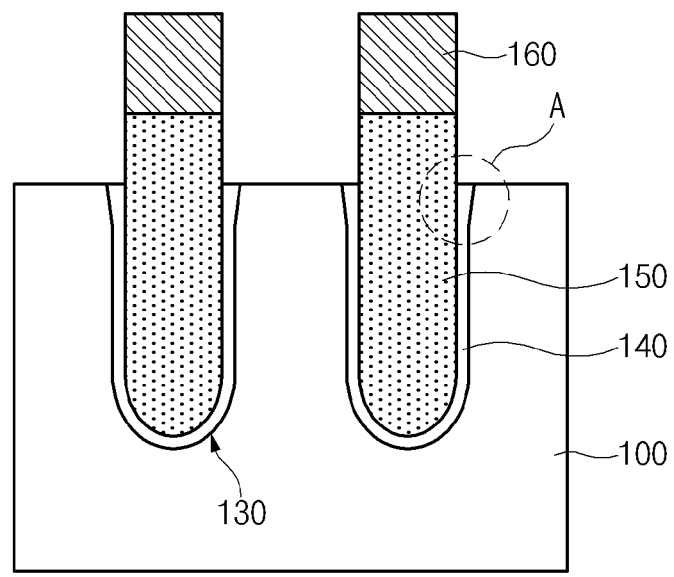

Referring to FIG. 1F, the exposed pad oxide layer 110 is removed from the upper surface of the substrate. A selective oxidation process is performed on the exposed gate electrode layer 140 so that a portion of the gate insulating layer 140 which is in contact with the gate electrode material 150 and the semiconductor substrate 100 is further oxidized. As seen in region "A", the selective oxidation process enlarges a portion of gate electrode layer 140 that is disposed towards the upper surface of the semiconductor. As a result, a thickness of the gate insulating layer 140 may be increased by about 0.05 nm to 10 nm. In an embodiment, because the effects of an exemplary selective oxidation device diminish according to depth, the enlarged part of gate insulating layer 140 may taper from a thicker top portion to a thinner lower portion.

In an embodiment, the selective oxidation process may be performed by controlling an oxidation time in order to minimize oxidation of the gate electrode material 150. The selective oxidation process is performed such as a thermal treatment method, a radical method, or a plasma method.

The selective oxidation process reduces the magnitude of GIDL between the gate electrode material 150 and source and drain regions that are formed in a subsequent process. The improvement of the GIDL characteristic results in an increase in data retention time in an exemplary memory cell.

Figure 1G:
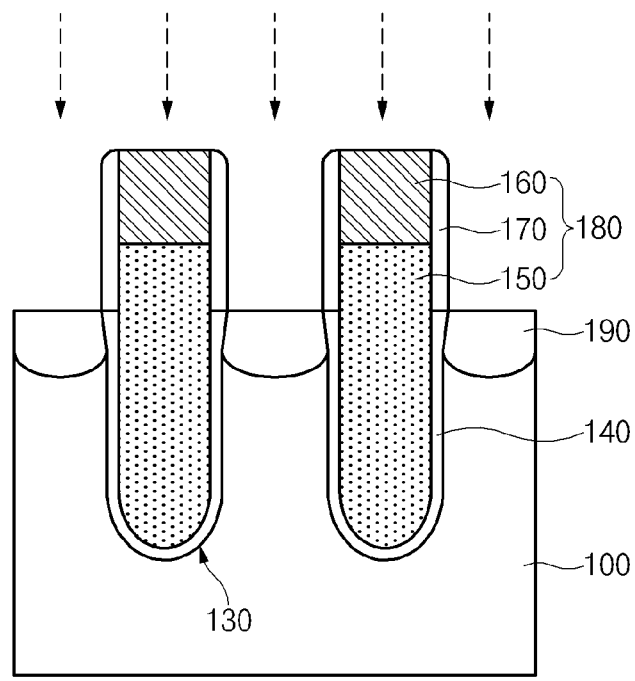

Referring to FIG. 1G, a spacer 170 is formed on sidewalls of the gate electrode material 150 and the second hard mask pattern 160 to form a buried gate 180. In an embodiment, the spacer 170 may include an oxide layer or a nitride layer. The spacer 170 may be formed to a thickness of 1 nm to 10 nm. In an embodiment, the thickness of spacer 170 is substantially the same as the thickness of the enlarged upper portion of gate insulating layer 140 shown in "A" of FIG. 1F.

Subsequently, ions having an opposite type to ions in semiconductor substrate 100 are implanted into exposed portions of semiconductor substrate 100 to form source and drain region 190. For example, when the semiconductor substrate 100 is a p type, the ions opposite type to the semiconductor substrate 100 are n type. In an embodiment, arsenic (As) or phosphoric (P) ions are implanted at a dose of $1\times10^{10}$ ions/$10^2$ to $1\times10^{15}$ ions/cm2 with an energy of 5 keV to 100 keV.

Figure 1H:
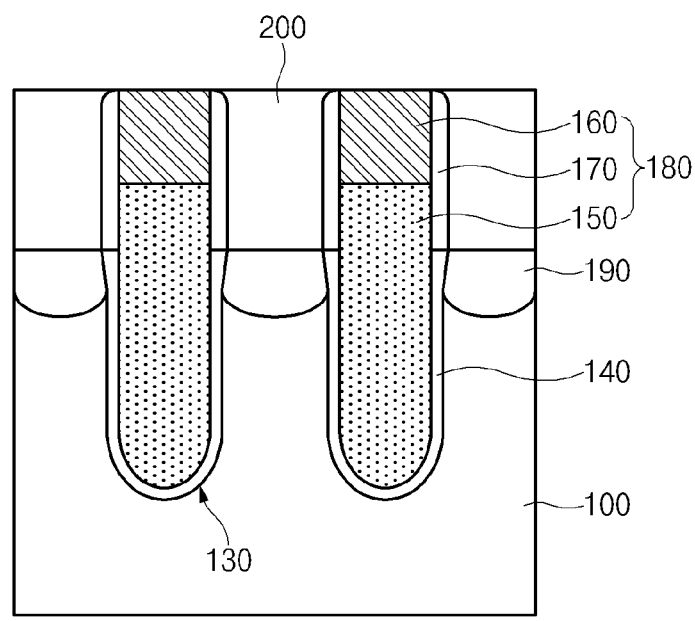

Referring to FIG. 1H, a polysilicon layer is buried between neighboring buried gates 180 and planarized to form a plug 200 on the source and drain regions 190. Here, the plug 200 may include an undoped polysilicon layer or a polysilicon layer doped with ions at a dose of $5\times10^{19}$ ions/cm$^2$ to $1\times10^{21}$ ions/cm$^2$. The plug 200 may be formed by growing a silicon layer through a selective epitaxial growth (SEG) process.

Figure 2:
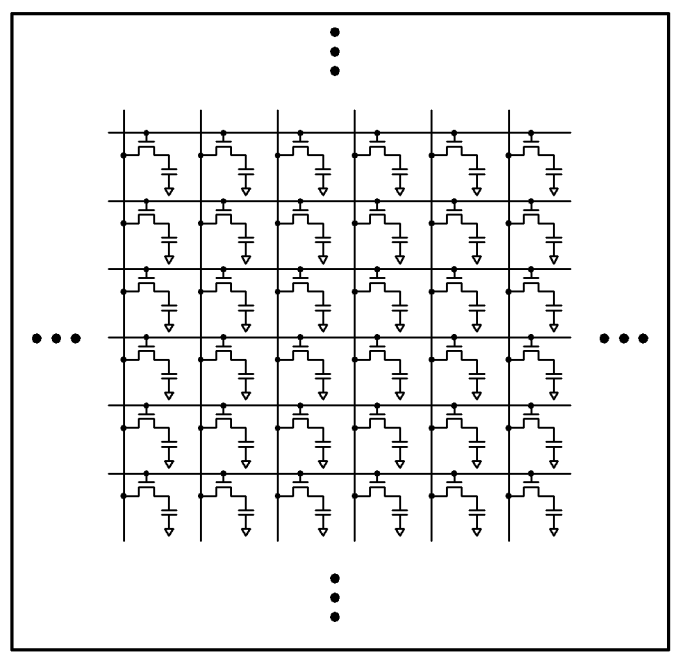
FIG. 2 is a block diagram illustrating a configuration of a cell array according to an exemplary embodiment of the present invention.

FIG. 2 is a block diagram illustrating a configuration of a cell array according to an exemplary embodiment of the present invention.

Referring to FIG. 2, a exemplary cell array includes a plurality of memory cells and each memory cell includes one transistor and one capacitor. The memory cells are disposed at intersections of bit lines BL1, . . . , BLn and word lines WL1, . . . , WLm, respectively. The memory cells store or output data based on voltages applied to a corresponding bit line of the bit lines BL1, . . . , BLn and a corresponding word line of the word lines WL1, . . . , WLm selected by the column decoder and a row decoder (not shown).

As shown in FIG. 2, in the cell array, the bit lines BL1, . . . , BLn are formed in a first direction (this is, bit line direction) which is a vertical direction in FIG. 2, and the word lines WL1, . . . , WLm are formed in a second direction (that is, word line direction) which is a horizontal direction in FIG. 2, so that the bit lines BL1, . . . , BLn and the word lines WL1, . . . , WLm intersect each other. A first terminal (for example, a drain terminal) of the transistor is connected to a corresponding bit line of the bit lines BL1, . . . , BLn, a second terminal (for example, a source terminal) is connected to the capacitor, and a third terminal (for example, a gate terminal) is connected to a corresponding word line of the word lines WL1, . . . , WLm. The bit lines BL1, . . . , BLn, the word lines WL1, . . . , WLm, and the plurality of memory cells are disposed within the semiconductor cell array.

Figure 3:
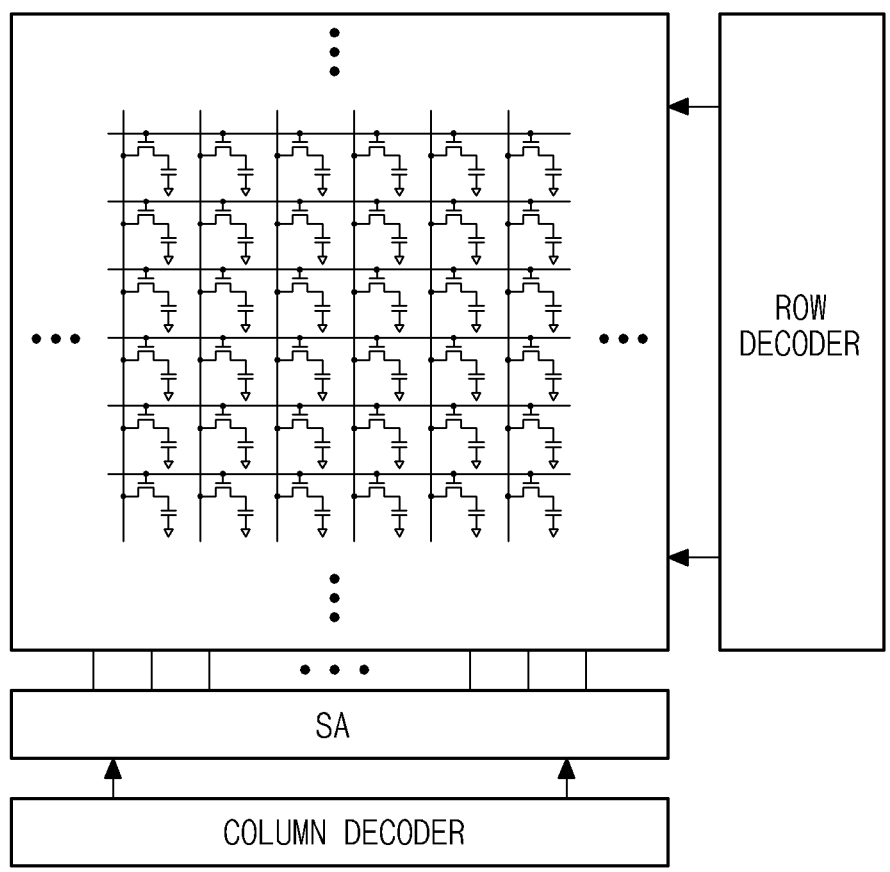
FIG. 3 is a block diagram illustrating a configuration of a semiconductor device according to an exemplary embodiment of the present invention.

FIG. 3 is a block diagram illustrating a configuration of a semiconductor device according to an exemplary embodiment of the present invention.

Referring to FIG. 3, the semiconductor device may include a semiconductor cell array, a row decoder, a column decoder, and a sense amplifier (SA). The row decoder selects a word line corresponding to a memory cell in which a read or write operation is to be performed from among word lines of the semiconductor cell array and outputs a word line select signal RS to the semiconductor cell array. The column decoder selects a bit line corresponding to a memory cell in which a read or write operation is to be performed from among bit lines of the semiconductor cell array and outputs a bit line select signal CS to the semiconductor cell array. Further, the sense amplifiers sense data BDS stored in a memory cell selected by the row decoder and the column decoder.

The semiconductor device may be connected to a microprocessor or a memory controller and receives control signals such as a write enable signal (WE*), a row address strobe (RAS*) signal, and a column address strobe (CAS*) signal from a microcontroller, receives data through an input/output (I/O) circuit, and stores the received data. Exemplary embodiments may be applied to dynamic random access memories (DRAMs), phase-change RAMs (PRAMs), magnetoresistance RAMs (MRAMs), NAND flash memories, CMOS image sensors (CISs), or the like. In particular, embodiments may be applied to desktop computers, laptop computers, and servers as DRAMs. In addition, the semiconductor device may be applied to graphic memories and mobile memories. The NAND flash memory may be applied to a portable storage device such as a memory stick, a multimedia card (MMC), a secure digital (SD), a compact flash (CF), an extreme digital (xD) picture card, a universal serial bus (USB) flash device, and various digital applications such as an MP3 player, a portable multimedia player (PMP), a digital camera, a camcorder, a memory card, a USB, a gaming apparatus, a navigation system, a laptop computer, a desktop computer, and a mobile phone. The CIS is an imaging device serving as a kind of an electronic film in a digital apparatus, and may be applied to a camera phone, a web camera, and a miniature medical photographing apparatus.

Figure 4:
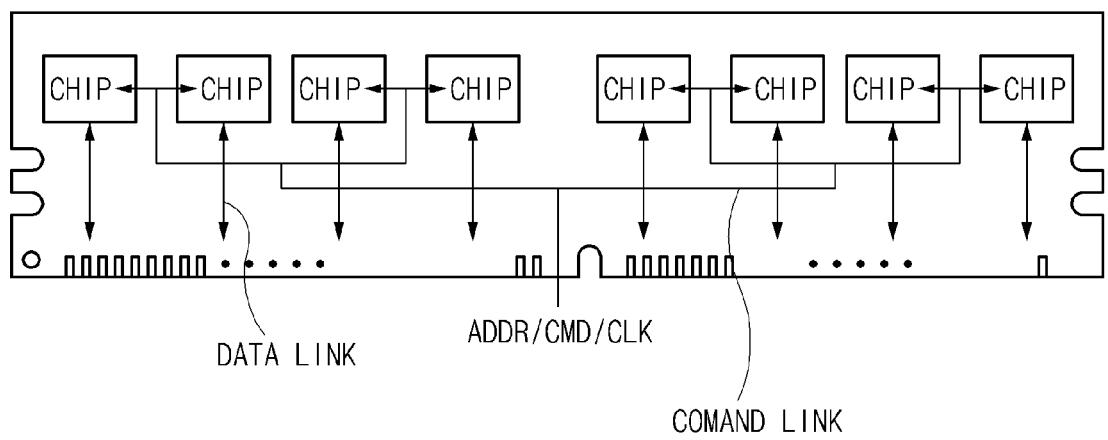
FIG. 4 is a block diagram illustrating a configuration of a semiconductor module according to an exemplary embodiment of the present invention.

FIG. 4 is a block diagram illustrating a configuration of a semiconductor module according to an exemplary embodiment of the present invention.

Referring to FIG. 4, a semiconductor module includes a plurality of semiconductor devices mounted on a module substrate, a command link which allows the semiconductor devices to receive control signals such as an address signal (ADDR), a command signal (CMD), a clock signal (CLK)) from an external controller (not shown), and a data link which is connected to the exemplary devices and transfers data to the exemplary devices.

The semiconductor devices may include the semiconductor device illustrated in FIG. 3. Embodiments may include a conventional command link and data link.

Although FIG. 4 shows 8 chips which include memory according to an exemplary embodiment mounted on a front surface of a module substrate, chips may also be mounted on a rear surface of the module substrate in the same manner. That is, exemplary memory may be mounted on one side or both sides of the module substrate. The number of semiconductor devices is not limited to the number shown in FIG. 4. In addition, the material and construction of the module substrate are not limited to the embodiment shown in FIG. 4.

Figure 5:
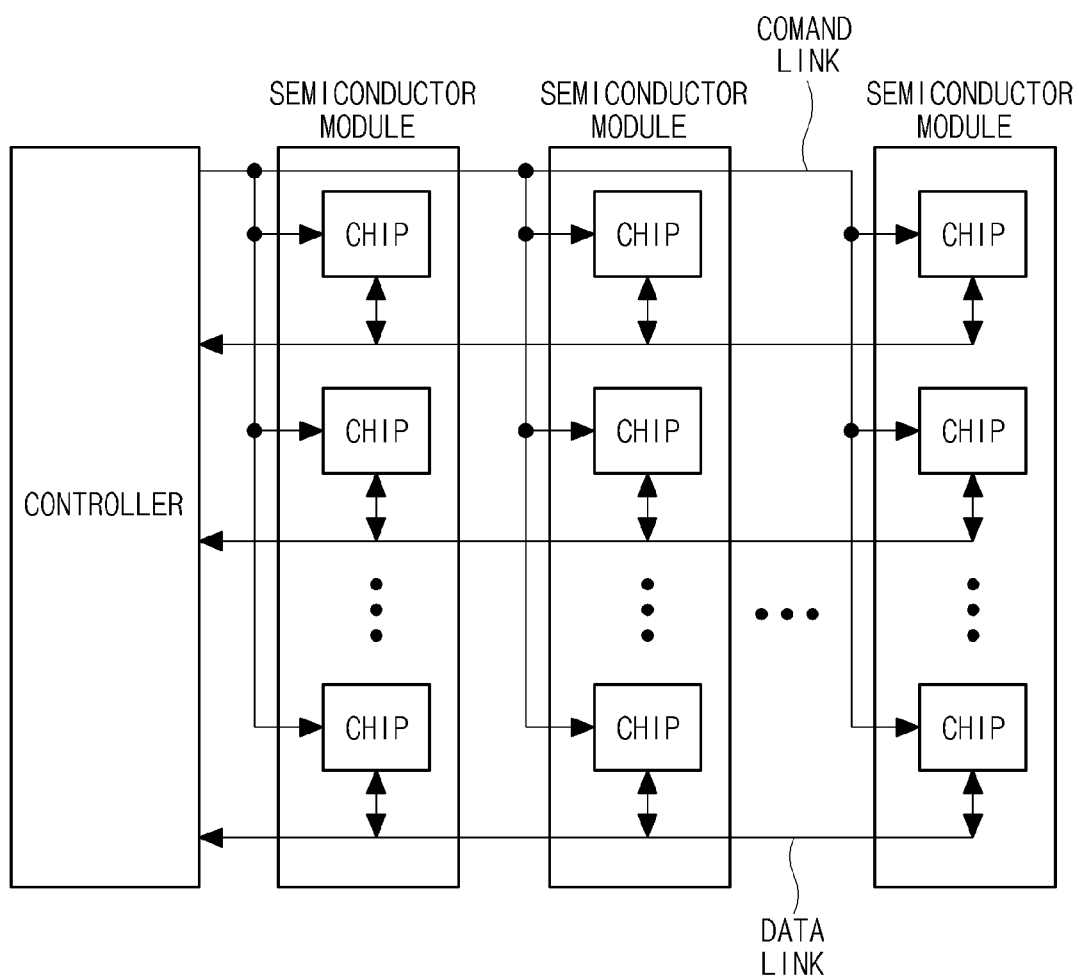
FIG. 5 is a block diagram illustrating a configuration of a semiconductor system according to an exemplary embodiment of the present invention.

FIG. 5 is a block diagram illustrating a configuration of a semiconductor system according to an exemplary embodiment of the present invention.

Referring to FIG. 5, an exemplary semiconductor system includes at least one semiconductor module on which a plurality of chips which include embodiments of the present invention are mounted, and a controller configured to provide a bidirectional interface between the semiconductor module and an external system (not shown) and control the semiconductor module. The controller may be the same or similar to a controller configured to control an operation of a plurality of modules in a conventional data processing system. Therefore, a detailed description will be omitted herein. In an embodiment, the semiconductor module may include the semiconductor module illustrated in FIG. 4.

Figure 6:
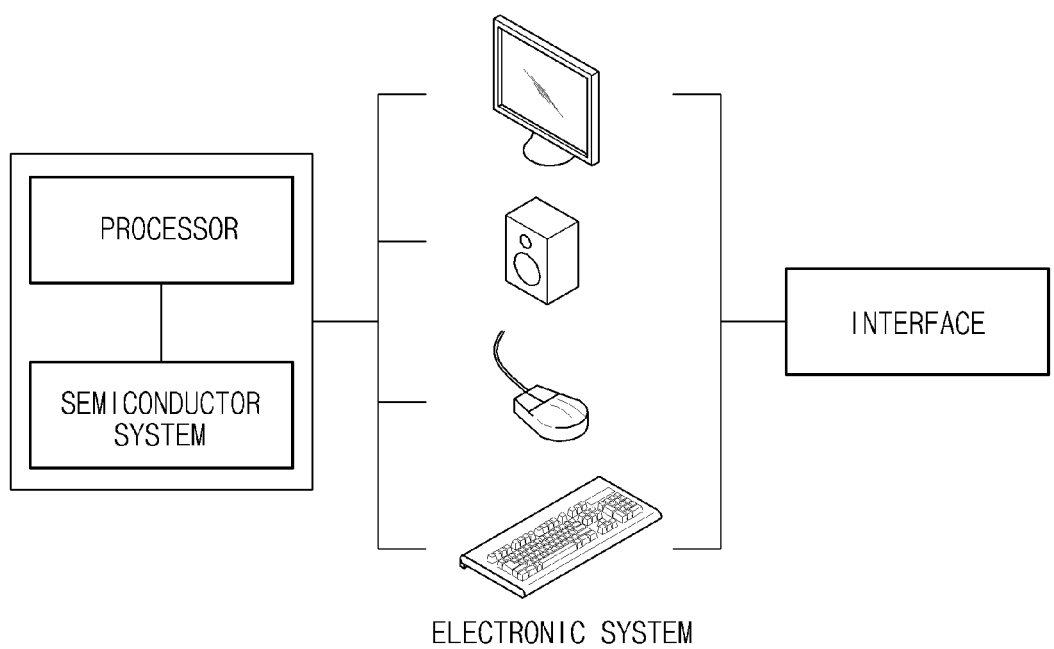
FIG. 6 is a block diagram illustrating configurations of an electronic unit and an electronic system according to an exemplary embodiment of the present invention.

FIG. 6 is a block diagram illustrating configurations of an electronic unit and an electronic system according to an exemplary embodiment of the present invention.

Referring to items shown on the left of FIG. 6, an electronic unit according to an exemplary embodiment includes a semiconductor system and a processor electrically connected to the semiconductor system. In an embodiment, the semiconductor system has the same configuration as the semiconductor system of FIG. 5. In the embodiment of FIG. 6, the processor includes a central processing unit (CPU), a micro processor unit (MPU), a micro controller unit (MCU), a graphics processing unit (GPU) or a digital signal processor (DSP).

Here, the CPU or MPU has a combined form of an arithmetic logic unit (ALU) which is an arithmetic and logical operation unit and a control unit (CU) which reads and interprets commands to control each unit. When the processor is a CPU or MPU, the electronic unit may include computer appliances or mobile appliances.

A GPU is a CPU for graphics applications which is used to process floating point operations. The GPU is a processor which draws graphics on a screen in real time. When the processor is a GPU, the electronic unit may include graphics appliances. A DSP is a processor which rapidly converts an analog signal (for example, audio) in a digital signal, calculates the converted signal, and uses the calculated result or converts the calculated result to an analog signal again. A DSP typically calculates digital values. When the processor is a DSP, the electronic unit may include audio and video appliances.

In addition, the processor may include an accelerated processor unit (APU). A processor may have a combined construction of a CPU with a GPU and serve as a graphic card.

Referring to items shown on the right side of FIG. 6, an exemplary electronic system includes at least one interface. The interface may include a monitor, a key board, a pointing device (mouse), a USB, a switch, a card reader, a keypad, a dispenser, a phone, a display, or a speaker. However, the present invention is not limited to the embodiments shown in FIG. 6.

As described above, according to an exemplary embodiment, after a trench is formed by etching a semiconductor substrate, an etching back process is not performed on a gate electrode material buried within the recess, so that variability in the depth of gates can be reduced and a stable operation of the transistor can be improved. In addition, GIDL can be improved through a selective oxidation process and control in a thickness of a spacer, resulting in an increase in data retention time.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method of manufacturing a semiconductor device, comprising:
    forming a first hard mask pattern on a semiconductor substrate;
    etching the semiconductor substrate to form a recess;
    forming a gate insulating layer and a gate electrode pattern within the recess;
    planarizing the gate electrode pattern until the first hard mask pattern is exposed;
    forming a second hard mask pattern on the planarized gate electrode pattern;
    removing the first hard mask pattern to expose sidewalls of the gate electrode pattern and an upper surface of the gate insulating layer;
    performing a selective oxidation process on the exposed upper surface of the gate insulating layer;
    forming a spacer on the exposed sidewalls of the second hard mask pattern and the planarized gate electrode pattern;
    forming source and drain regions on the semiconductor substrate; and
    forming a plug on each of the source and drain region.

2. The method of claim 1, wherein the recess is formed to a depth of 50 nm to 300 nm.

3. The method of claim 1, further comprising performing a thermal treatment process using a gas ambient including hydrogen gas (H2) after the forming the recess.

4. The method of claim 1, wherein the forming the gate insulating layer includes forming the gate insulating layer using an oxidation process including a thermal treatment method, a radical method, or a plasma method.

5. The method of claim 1, wherein the gate electrode pattern includes any one selected from the group consisting of titanium nitride (TiN) layer, a tungsten (W) layer, a tungsten nitride (WN) layer, a stacking structure of WN and W, and a stacking structure of TiN and W.

6. The method of claim 1, wherein the spacer is formed to a thickness of 1 nm to 20 nm.

7. The method of claim 1, wherein the forming the recess includes anisotropically etching the semiconductor substrate.

8. The method of claim 1, wherein the forming the source and drain regions includes implanting ions having an opposite type to the semiconductor substrate at a dose of $1\times10^{10}$ ions/cm$^2$ to $1\times10^{15}$ ions/cm$^2$ with an energy of 5 keV to 100 keV.

9. The method of claim 1, wherein the forming the plug includes combining an undoped polysilicon layer and ions or forming a polysilicon layer doped with ions at a concentration of of $5\times10^{19}$ ions/cm$^2$ to $1\times10^{21}$ ions/cm$^2$.

10. The method of claim 1, wherein the forming the plug includes forming a doped polysilicon layer having a concentration of $5\times10^{19}$ ions/cm$^2$ to $1\times10^{21}$ ions/cm$^2$.

11. A method of forming a semiconductor device, comprising:
    forming a first hard mask pattern over a semiconductor substrate;
    etching the substrate using the first hard mask pattern as a mask to form a recess;
    forming a gate insulating material on inner surfaces of the recess;
    depositing a gate electrode material inside the recess;
    planarizing the gate electrode material until the first hard mask pattern is exposed;
    forming a second hard mask pattern over the planarized gate electrode material;

removing the first hard mask pattern to expose sidewalls of the planarized gate electrode material and an upper portion of the gate insulating material;

performing a selective oxidation process to increase a thickness of the upper portion of the gate insulating material; and forming a spacer over the exposed sidewalls of the gate electrode material and the second hard mask pattern.

12. The method of claim 11, further including:

implanting ions in portions of the semiconductor substrate between neighboring recesses to form source and drain regions; and forming plugs over the source and drain regions.

13. The method of claim 11, wherein the thickness of the upper portion of the gate insulating layer is substantially the same as the thickness of the spacer.

14. The method of claim 11, wherein the gate insulating layer has a shape that tapers between the greater thickness of the upper portion and a lesser thickness of the lower portion.

15. The method of claim 11, wherein removing the first hard mask pattern includes an etching process using the second hard mask pattern as a mask.

16. The method of claim 11, wherein the first hard mask layer includes first and second pad layers.

17. The method of claim 16, wherein the first pad layer is an oxide layer, and the second pad layer is a nitride layer.

18. The method of claim 17, further including:

removing the second pad layer with an etching process using the second hard mask pattern as a mask.

19. The method of claim 18, further including removing the first pad layer, wherein the first pad layer is removed in a separate process from the etching process used to remove the second pad layer.

20. The method of claim 1, wherein the spacer covers the upper portion of the gate insulation layer having the increased thickness.

* * * * *